United States Patent [19]

Kitao

[11] Patent Number: 5,712,586
[45] Date of Patent: Jan. 27, 1998

[54] SEMICONDUCTOR INTEGRATED SYSTEM COMPRISING AN OUTPUT VOLTAGE LEVEL-SELECTING CIRCUIT

[75] Inventor: Ichiro Kitao, Tokyo, Japan

[73] Assignee: NEC Corporation, Tokyo, Japan

[21] Appl. No.: 669,181

[22] Filed: Jun. 24, 1996

[30] Foreign Application Priority Data

Jun. 23, 1995 [JP] Japan .................... 7-157378

[51] Int. Cl.⁶ ............................................. H03K 5/00
[52] U.S. Cl. ........................................ 327/333; 326/80
[58] Field of Search .................... 327/333, 415, 327/530, 538; 326/80, 81, 63

[56] References Cited

U.S. PATENT DOCUMENTS 5,493,244 2/1996 Pathak et al. ........................ 327/333
5,534,801 7/1996 Wu et al. .............................. 326/81
5,583,454 12/1996 Hawkins et al. .................... 326/81

FOREIGN PATENT DOCUMENTS 4-284522 10/1992 Japan ............................ G06F 1/00

Primary Examiner—Toan Tran

[57] ABSTRACT

In a semiconductor integrated system comprising an internal circuit (6) for operating in an internal voltage having a low voltage level and for producing an output control signal and an output signal having the low voltage level, a voltage level-selecting circuit (23) selects one of high and low level output terminals in response to the output control signal to supply the output signal to the one of the high and low level output terminals. A voltage level shifter (7) shifts the output signal to produce a shifted output signal having a high voltage level which is higher than the low voltage level.

6 Claims, 4 Drawing Sheets

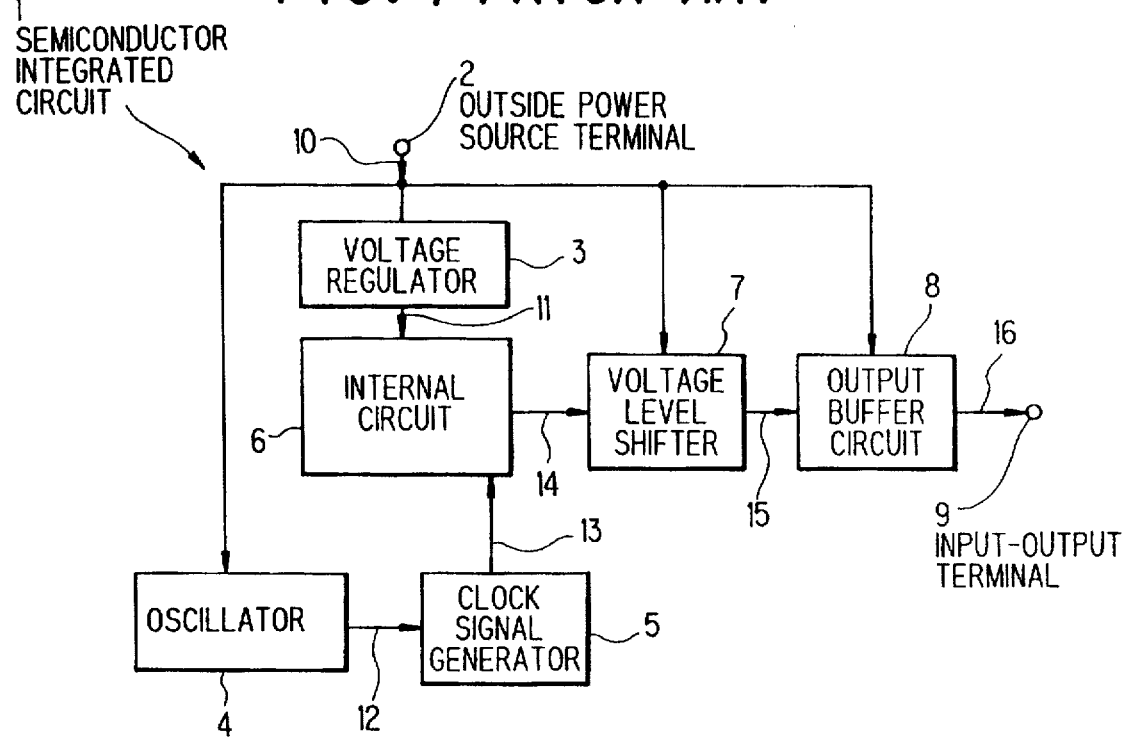

SEMICONDUCTOR INTEGRATED SYSTEM COMPRISING AN OUTPUT VOLTAGE LEVEL-SELECTING CIRCUIT

FIELD OF THE INVENTION

The invention relates to a semiconductor integrated system, and more particularly, a semiconductor integrated system comprising a plurality of semiconductor integrated circuits for operating in different voltages which have different voltage levels.

BACKGROUND OF THE INVENTION

A conventional semiconductor integrated system of the type described is disclosed in Japanese Patent Laid Open Publication (Kokai) No. 284522/1992. In the manner which will later be described more in detail, this conventional semiconductor integrated system comprises a semiconductor integrated circuit comprising an outside power source terminal, a voltage regulator, an internal circuit, a voltage level shifter, an output buffer circuit, and an input-output terminal.

The outside power source terminal is supplied with an outside voltage having a high voltage level from an outside power source. For example, the outside voltage is 5V. The voltage regulator is connected to the outside power source terminal and is supplied with the outside voltage. The voltage regulator lowers the outside voltage to produce an internal voltage having a low voltage level which is lower than the high voltage level of the outside voltage. For example, the internal voltage is 3 V.

The internal circuit comprises a central processing unit, a memory unit, and other units or circuits. The internal circuit operates in the internal voltage to produce an output signal having the low voltage level and to supply the output signal to the voltage level shifter. The voltage level shifter shifts the output signal to produce a shifted output signal having the high voltage level. The output buffer circuit buffers the shifted output signal from the voltage level shifter to produce a buffered output signal and to supply the buffered output signal to the input-output terminal.

In addition, another semiconductor integrated circuit which is operated in a low voltage is known in the art and is hereafter called a low level circuit. For example,the low voltage is 3 V. Also, a further semiconductor integrated circuit which is operated in a high voltage is known in the art and is hereafter called a high level circuit. For example, the high voltage is 5 V.

In order to decrease the consumption of electric power, the conventional semiconductor integrated system comprises the semiconductor integrated circuit, the low level circuit, the high level circuit, a voltage regulator, and a voltage level shifter. The semiconductor circuit, the high level circuit, and the voltage regulator are in parallel connected to the outside power source and are supplied with the high voltage from the outside power source. The low level circuit is connected between the voltage regulator and the outside power source. The voltage level shifter is connected between the semiconductor integrated circuit and the low level circuit.

The semiconductor integrated circuit supplies the buffered output signal to the high level circuit and the voltage level shifter. The voltage level shifter shifts the buffered output signal to produce a shifted output signal having the low voltage level and to supply the shifted output signal to the low level circuit. The voltage regulator regulates the high voltage from the outside power source to produce the low voltage and to supply the low voltage to the low level circuit.

However, inasmuch as the semiconductor integrated system needs the voltage regulator and the voltage level shifter, the semiconductor integrated system has a disadvantage in that a size is large and a cost is increased.

SUMMARY OF THE INVENTION

Accordingly, it is an object of the invention to provide a semiconductor integrated system which has an advantage in that a size is small and a cost is decreased.

Other objects of the invention will become clear as the description proceeds.

According to an aspect of the invention, there is provided a semiconductor integrated system which comprises:

an internal circuit for operating in an internal voltage having a low voltage level and for producing an output control signal and an output signal having the low voltage level;

a voltage level-selecting circuit connected to the internal circuit, the voltage level-selecting circuit having high and low level output terminals for selecting one of the high and low level output terminals in response to the output control signal to supply the output signal to the one of the high and low level output terminals; and a voltage level shifter connected to the high level output terminal for shifting the output signal to produce a shifted output signal having a high voltage level which is higher than the low voltage level.

According to another aspect of the invention, there is provided a semiconductor integrated system which comprises:

a voltage regulator for receiving an outside voltage having a high voltage level and for lowering the outside voltage to produce an internal voltage having a low voltage level which is lower than the high voltage level;

an internal circuit for operating in the internal voltage having the low voltage level and for producing an output control signal and an output signal having the low voltage level;

a voltage level-selecting circuit connected to the internal circuit, the voltage level-selecting circuit having high and low level output terminals for selecting one of the high and low level output terminals in response to the output control signal to supply the output signal to the one of the high and low level output terminals; and a voltage level shifter connected to the high level output terminal for shifting the output signal to produce a shifted output signal having the high voltage level.

BRIEF DESCRIPTION OF THE DRAWINGS

The invention will be explained in more detail in conjunction with appended drawings, wherein:

FIG. 1 is a block diagram of a conventional semiconductor integrated circuit of a conventional semiconductor integrated system;

FIG. 2 is a block diagram of the conventional semiconductor integrated system comprising the conventional semiconductor integrated circuit illustrated in FIG. 1;

DESCRIPTION OF THE PREFERRED EMBODIMENTS

Figure 3:
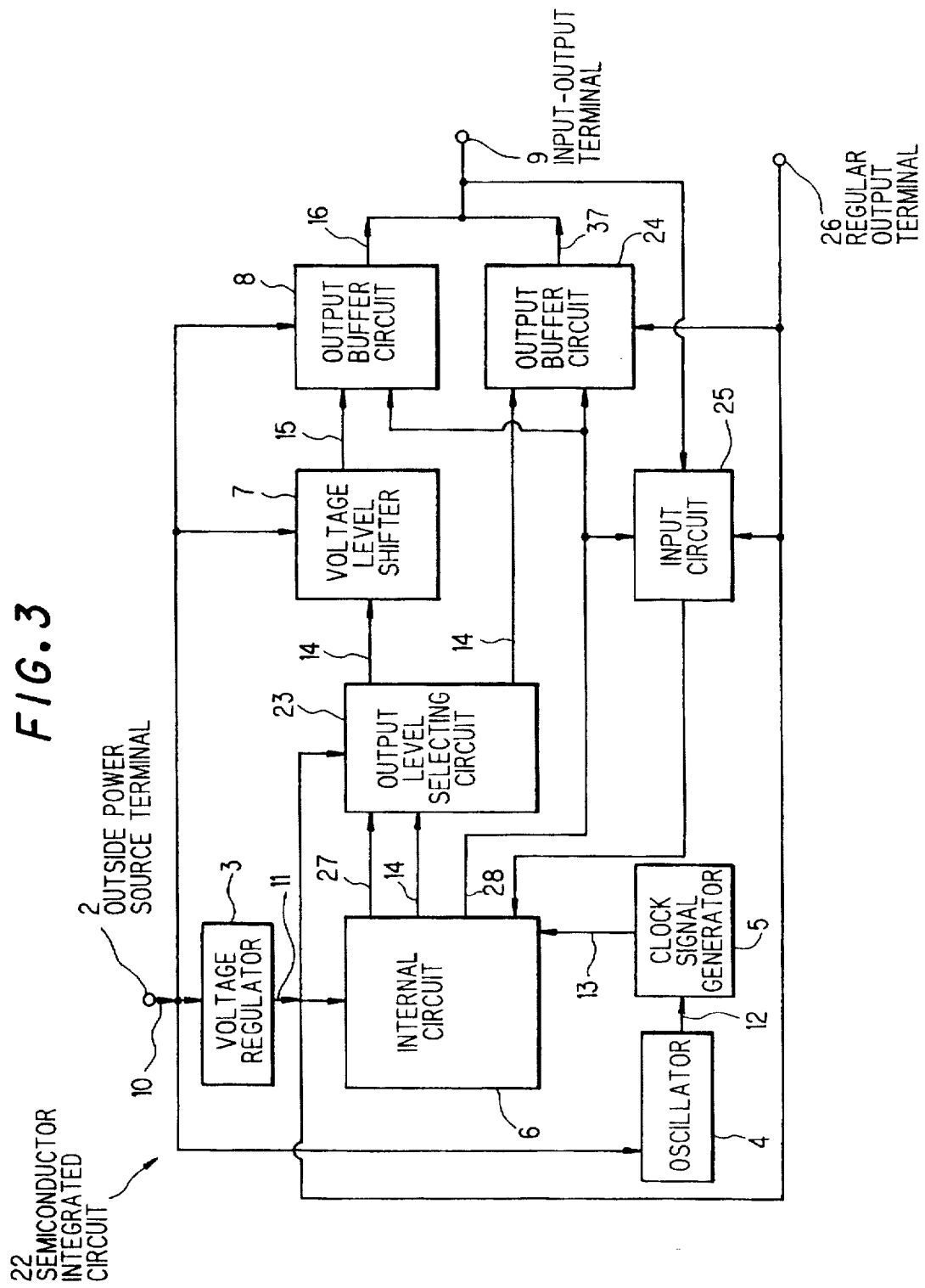
FIG. 3 is a block diagram of a semiconductor integrated circuit of a semiconductor integrated system according to a first embodiment of the invention.

Before explaining a semiconductor integrated system according to the invention, the aforementioned conventional semiconductor integrated system will be explained in FIGS. 1 and 2.

The conventional semiconductor integrated system comprises a semiconductor integrated circuit 1 comprising an outside power source terminal 2, a voltage regulator 3, an oscillator 4, a clock signal generator 5, an internal circuit 6, a voltage level shifter 7, an output buffer circuit 8, and an input-output terminal 9.

The outside power source terminal 2 is supplied with an outside voltage 10 having a high voltage level from a outside power source (not shown). For example, the outside voltage 10 is a voltage of 5 V. The voltage regulator 3 is connected to the outside power source terminal 2 and is supplied with the outside voltage 10. The voltage regulator 3 lowers the outside voltage 10 to produce an internal voltage 11 having an low voltage level which is lower than the high voltage level of the outside voltage 10. For example, the internal voltage 11 is a voltage of 3 V.

The oscillator 4 is connected to the outside power source terminal 2 an d is supplied with the outside voltage 10. The oscillator 4 generates an oscillation signal 12 to supply the oscillation signal 12 to the clock signal generator 5. The clock signal generator 5 generates a clock signal 13 in response to the oscillation signal 12 to supply the clock signal 13 to the internal circuit 6.

The internal circuit 6 comprises a central processing unit (not shown), a memory unit (not shown), and other units or circuits (not shown). The internal circuit 6 operates in the internal voltage 11 and in response to the clock signal 13 to produce an output signal 14 having the low voltage level and to supply the output signal 14 to the voltage level shifter 7. The voltage level shifter 7 is connected among the outside power source terminal 2, the internal circuit 6, and the output buffer circuit 8. The voltage level shifter 7 shifts the output signal 14 to produce a shifted output signal 15 having the high voltage level. The output buffer circuit 8 is connected among the outside power source terminal 2, the voltage level shifter 7, and the input-output terminal 9. The output buffer circuit 8 buffers the shifted output signal 15 from the voltage level shifter 7 to produce a buffered output signal 16 and to supply the buffered output signal 16 to the input-output terminal 9.

In addition, another semiconductor integrated circuit is operated in a low voltage is known in the art and is hereafter called a low level circuit. For example,the low voltage is a voltage of 3 V. Also, a further semiconductor integrated circuit is operated in a high voltage is known in the art is hereafter called a high level circuit. For example,the high voltage is a voltage of 5 V.

Referring to FIG. 2, the description will proceed to a conventional semiconductor integrated system comprising the semiconductor circuit 1.

In order to decrease consumption of an electric power, the conventional semiconductor integrated system comprises the semiconductor integrated circuit 1, the low level circuit 17, the high level circuit 18, a voltage regulator 19, and a voltage level shifter 20. The semiconductor circuit 1, the high level circuit 18, and the voltage regulator 19 are in parallel connected to the outside power source 21 and are supplied with the high voltage from the outside power source 21. The low level circuit 17 is connected between the voltage regulator 19 and the ground. The voltage level shifter 20 is connected between the semiconductor integrated circuit 1 and the low level circuit 17.

The semiconductor integrated circuit 1 supplies the buffered output signal 16 to the high level circuit 18 and the voltage level shifter 20. The voltage level shifter 20 shifts the buffered output signal 16 to produce another shifted output signal having the low voltage level and to supply the shafted output signal to the low level circuit 17. The voltage regulator 19 regulates the high voltage from the outside power source 21 to produce the low voltage and to supply the low voltage to the low level circuit 17.

However, inasmuch as the conventional semiconductor integrated rated system needs the voltage regulator 19 and the voltage level shifter 20, the semiconductor integrated system has a disadvantage An that a size is large and that a cost is increased.

Figure 4:
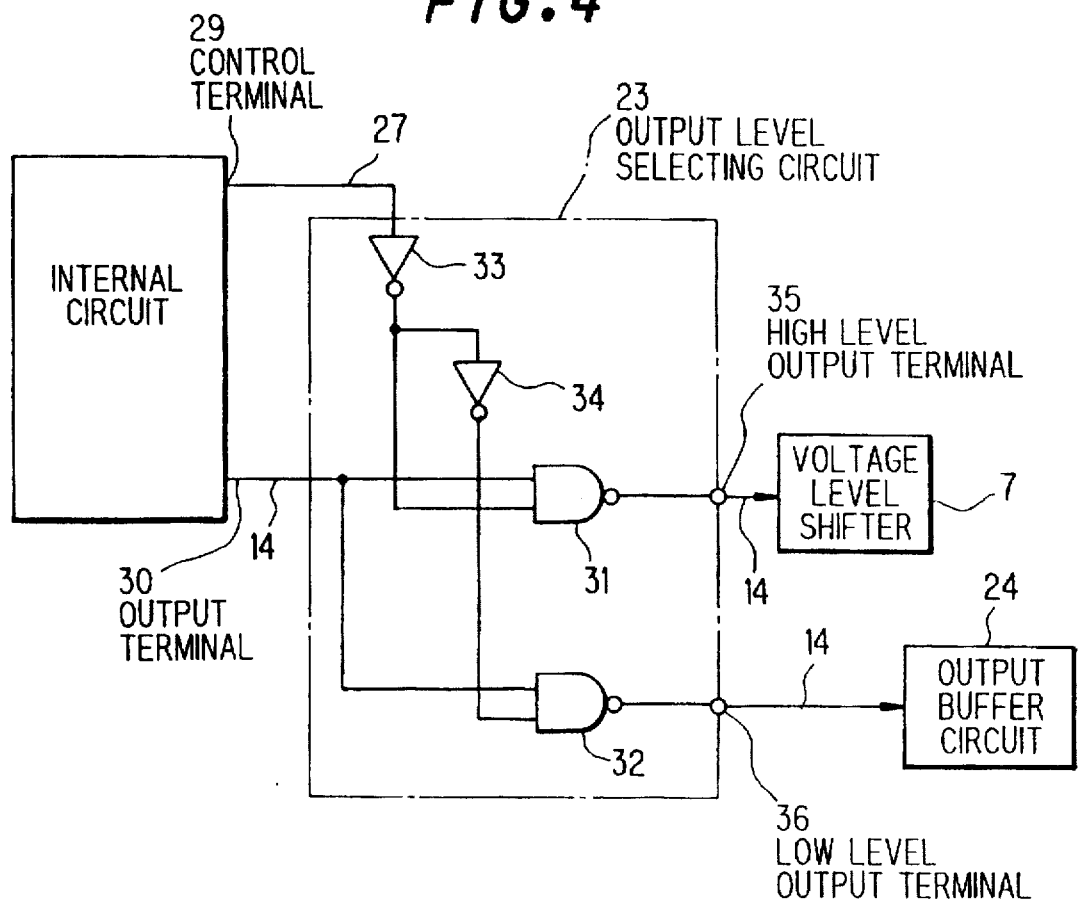
FIG. 4 is a block diagram of a part of the semiconductor integrated circuit illustrated in FIG. 3.
Figure 5:
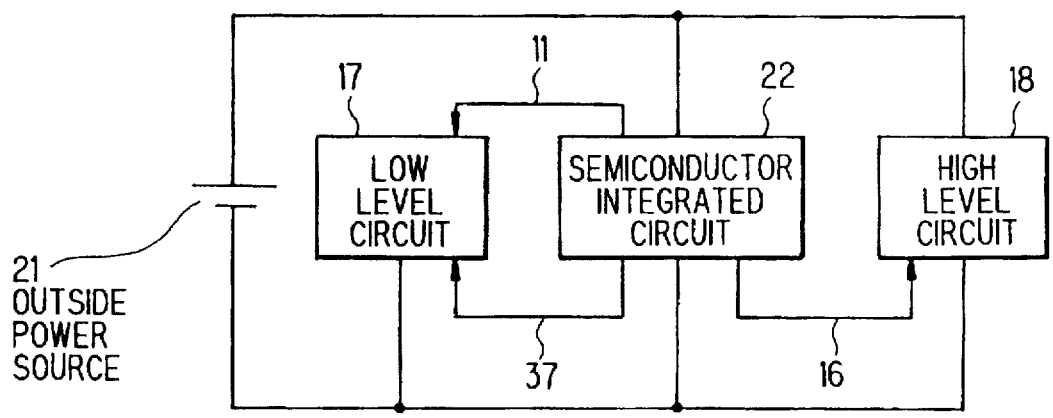
FIG. 5 is a block diagram of the semiconductor integrated system according to the first embodiment of the invention.

Referring to FIGS. 3 to 5, the description will proceed to a semiconductor integrated system according to a first embodiment of the invention. Similar parts are designated by like reference numerals.

The semiconductor integrated system comprises a semiconductor integrated circuit 22 comprising the outside power source terminal 2, the voltage regulator 3, the oscillator 4, the clock signal generator 5, the internal circuit 6, the voltage level shifter 7, the output buffer circuit 8, and an input-output terminal 9. The semiconductor integrated circuit 22 further comprises an output level-selecting circuit 23, another output buffer circuit 24, an input circuit 25, and a regular output terminal 26. The voltage regulator 3, the oscillator 4, the clock signal generator 5, the voltage level shifter 7, and the output buffer circuit 8 are operated in the outside voltage 10. The oscillator 4, and the clock signal generator 5 may be operated in the internal voltage 11. The internal circuit 6, the voltage level shifter 7, the output level-selecting circuit 23, the output buffer circuit 24, and the input circuit 25 are operated in the internal voltage 11.

The output level-selecting circuit 23 is connected among the voltage regulator 3, the internal circuit 6, and the voltage level shifter 7. The output buffer circuit 24 is connected among the voltage regulator 3, the internal circuit 6, and the input-output terminal 9. The input circuit 25 is connected among the voltage regulator 3, the internal circuit 6, and the input-output terminal 9. The regular terminal 26 is connected to the voltage output regulator 3.

The internal circuit 6 produces an output control signal 27, the output signal 14 having the low voltage level, and a switch control signal 28 in response to the program command signal. The program command signal is held by the internal circuit 6. Also, the internal circuit 6 may be supplied with the program command signal through the input-output terminal 9 and the input circuit 25 from an outside memory unit (not shown). The internal circuit 6 supplies the output control signal 27 and the output signal 14 to the output level-selecting circuit 23. Also, the internal circuit 6 supplies the switch control signal 28 to the output buffer circuits 8 and 24 and the input circuit 25.

As shown in FIG. 4, the internal circuit 6 outputs the output control signal 27 through a control terminal 29 and the output signal 14 through an output terminal 30. The voltage level-selecting circuit 23 comprises a first NAND circuit 31, a second NAND circuit 32, a first inverter 33 connected between the control terminal 29 of the internal circuit 6 and an input terminal of the first NAND circuit 31, and a second inverter 34 connected between an output terminal of the first inverter 33 and an input terminal of the second NAND circuit 32. Another input terminal of the first NAND circuit 31 is connected to the output terminal 30 of the internal circuit 6. Also, another input terminal of the second NAND circuit 32 is connected to the output terminal 30 of the internal circuit 6. An output terminal of the first NAND circuit 31 is connected to a high level output terminal 35. The voltage level shifter 7 is connected to the high level output terminal 35. An output terminal of the second NAND circuit 32 is connected to a low level output terminal 36. The output buffer circuit 24 is connected to the low level output terminal 36.

When the output control signal 27 is "high", the voltage level-selecting circuit 23 supplies the output signal 14 to the voltage level shifter 7. When the output control signal 27 is "low", the voltage level-selecting circuit 23 supplies the output signal 14 to the output buffer circuit 24. Namely, the voltage level-selecting circuit 23 selects one of the high and low level output terminals 35 and 36 in response to the output control signal 27 to supply the output signal 14 to the one of the high and low level output terminals 35 and 36. When the output buffer circuit 24 is supplied with the output signal 14, the output buffer circuit 24 buffers the output signal 14 to produce a buffered output signal 37 and to supply the buffered output signal 37 to the input-output terminal 9.

Turning back to FIG. 3, when the switch control signal 28 is "high", the output buffer circuits 8 and 24 are active. When the switch control signal 28 is "low", the input circuit 25 is active.

In FIG. 5, the semiconductor integrated system comprises the semiconductor integrated circuit 22, the low level circuit 17, and the high level circuit 18. The semiconductor integrated circuit 22 and the high level circuit 18 are connected in parallel to the outside power source 21. The low level circuit 17 is supplied with the internal voltage 11 and the buffered output signal 37 from the semiconductor integrated circuit 22. The high level circuit 18 is supplied with the buffered output signal 16 from the semiconductor integrated circuit 22. Thus, the semiconductor integrated system does not need the voltage regulator 19 and the voltage level shifter 20 (FIG. 2).

Figure 6:
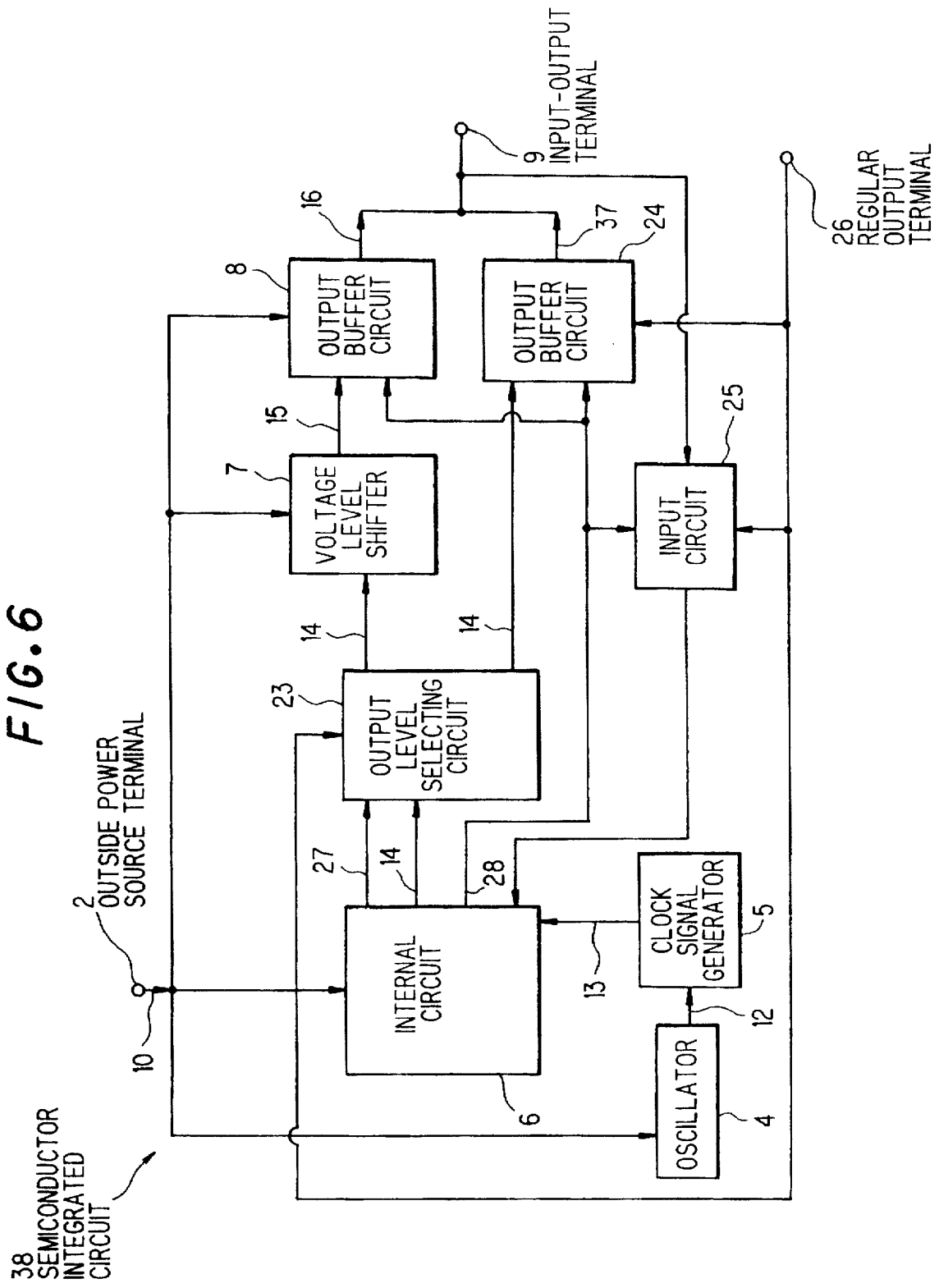
FIG. 6 is a block diagram of a semiconductor integrated circuit of a semiconductor integrated system according to a second embodiment of the invention.

Referring to FIG. 6, the description will proceed to a semiconductor integrated system according to a second embodiment of the invention. Similar parts are designated by like reference numerals.

The semiconductor integrated system comprises a semiconductor integrated circuit 38. The semiconductor integrated circuit 38 is similar to the semiconductor integrated circuit 22 of FIG. 3 except the voltage regulator 3. In this event, the outside power source terminal 2 is supplied with another outside voltage having the low voltage level from another outside power source (not shown).

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed:

1. A semiconductor integrated system comprising:

an internal circuit for operating in an internal voltage having a low voltage level and for producing an output control signal and an output signal having said low voltage level;

a voltage level-selecting circuit connected to said internal circuit, said voltage level-selecting circuit having high and low level output terminals for selecting one of said high and low level output terminals in response to said output control signal to supply said output signal to said one of said high and low level output terminals; and a voltage level shifter connected to said high level output terminal for shifting said output signal to produce a shifted output signal having a nigh voltage level which is higher than said low voltage level.

2. A semiconductor integrated system as claimed in claim 1, wherein said internal circuit produces said output control signal in response to a program command signal.

3. A semiconductor integrated system as claimed in claim 1, wherein said voltage level-selecting circuit is operated in said internal voltage.

4. A semiconductor integrated system comprising:

a voltage regulator for receiving an outside voltage having a high voltage level and for lowering said outside voltage to produce an internal voltage having a low voltage level which is lower than said high voltage level;

an internal circuit for operating in said internal voltage having said low voltage level and for producing an output control signal and an output signal having said low voltage level;

a voltage level-selecting circuit connected to said internal circuit, said voltage level-selecting circuit having high and low level output terminals for selecting one of said high and low level output terminals in response to said output control signal to supply said output signal to said one of said high and low level output terminals; and a voltage level shifter connected to said high level output terminal for shifting said output signal to produce a shifted output signal having said high voltage level.

5. A semiconductor integrated system as claimed in claim 4, wherein said internal circuit produces said output control signal in response to a program command signal.

6. A semiconductor integrated system as claimed in claim 4, wherein said voltage level-selecting circuit is operated in said internal voltage.

* * * * *